(12) United States Patent
Chakraborty et al.

(10) Patent No.: US 11,388,822 B2
(45) Date of Patent: Jul. 12, 2022

(54) METHODS FOR IMPROVED POLYMER-COPPER ADHESION

(71) Applicant: Applied Materials, Inc., Santa Clara, CA (US)

(72) Inventors: Tapash Chakraborty, Maharashtra (IN); Steven Verhaverbeke, San Francisco, CA (US); Han-Wen Chen, Cupertino, CA (US); Chintan Buch, Santa Clara, CA (US); Prerna Goradia, Mumbai (IN); Giback Park, Santa Clara, CA (US); Kyuil Cho, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 39 days.

(21) Appl. No.: 17/005,954

(22) Filed: Aug. 28, 2020

(65) Prior Publication Data
US 2022/0071023 A1  Mar. 3, 2022

(51) Int. Cl.
*H05K 1/02* (2006.01)
*H05K 3/00* (2006.01)
(Continued)

(52) U.S. Cl.
CPC .............. *H05K 3/386* (2013.01); *B32B 7/12* (2013.01); *B32B 15/08* (2013.01); *H05K 3/0061* (2013.01);
(Continued)

(58) Field of Classification Search
CPC ........ H05K 1/02; H05K 1/115; H05K 1/0222; H05K 3/00; H05K 3/06; H05K 3/19; H05K 3/28; H05K 3/46; H05K 3/52; H05K 3/025; H05K 3/0038; H05K 3/384; H05K 3/386; H05K 3/421; H05K 3/485; H05K 3/3114;
(Continued)

(56) References Cited

U.S. PATENT DOCUMENTS 5,421,083 A * 6/1995 Suppelsa ............... H05K 1/0222
174/250
5,827,604 A * 10/1998 Uno ...................... H05K 3/4661
428/209
(Continued)

FOREIGN PATENT DOCUMENTS

JP    H06264003 A    9/1994
JP    H07212039 A    8/1995
(Continued)

OTHER PUBLICATIONS

"Easy Guide for use of ABF Manual", Research Institute for Bioscience Products & Fine Chemicals, Ajinomoto Co., Inc. (2019), 8 pages.
(Continued)

*Primary Examiner* — Xiaoliang Chen
(74) *Attorney, Agent, or Firm* — Servilla Whitney LLC

(57) ABSTRACT

Methods for forming circuit boards and circuit boards using an adhesion layer are described. A substrate with two surfaces is exposed to a bifunctional organic compound to form an adhesion layer on the first substrate surface. A resin layer is then deposited on the adhesion layer and the exposed substrate surfaces. Portions of the resin layer may be removed to expose metal pads for contacts.

20 Claims, 1 Drawing Sheet

(51) Int. Cl.
| | |
|---|---|
| *H05K 3/06* | (2006.01) |
| *H05K 3/28* | (2006.01) |
| *H05K 3/46* | (2006.01) |
| *H05K 3/38* | (2006.01) |
| *B32B 15/08* | (2006.01) |
| *B32B 7/12* | (2006.01) |

(52) U.S. Cl.
CPC ...... *B32B 2457/08* (2013.01); *H05K 2203/06* (2013.01)

(58) Field of Classification Search
CPC .. H05K 3/3171; H05K 3/4652; H05K 3/5329; H05K 2203/06
USPC .......... 174/250, 36; 361/792; 438/443, 685, 438/706, 737, 744, 745, 756; 29/830, 29/846, 847, 853
See application file for complete search history.

(56) References Cited

U.S. PATENT DOCUMENTS

| | | | | |
|---|---|---|---|---|
| 6,187,680 | B1* | 2/2001 | Costrini | H01L 24/13 |
| | | | | 438/653 |
| 6,240,636 | B1* | 6/2001 | Asai | H05K 3/4652 |
| | | | | 29/830 |
| 6,479,900 | B1* | 11/2002 | Shinogi | H01L 23/5329 |
| | | | | 257/773 |
| 6,528,881 | B1* | 3/2003 | Tsuboi | H01L 24/03 |
| | | | | 257/781 |
| 6,649,533 | B1* | 11/2003 | Iacoponi | H01L 24/03 |
| | | | | 438/719 |
| 6,674,017 | B1* | 1/2004 | Yamasaki | H05K 3/421 |
| | | | | 29/853 |
| 6,884,944 | B1* | 4/2005 | Kuwako | H05K 3/025 |
| | | | | 174/250 |
| 7,375,021 | B2* | 5/2008 | Edelstein | H01L 24/03 |
| | | | | 257/E23.021 |
| 8,450,206 | B2* | 5/2013 | Walter | H01L 24/03 |
| | | | | 438/638 |
| 10,477,700 | B2 | 11/2019 | Cho et al. | |
| 2007/0212478 | A1 | 9/2007 | Fukunaga et al. | |
| 2008/0174009 | A1 | 7/2008 | Shih | |
| 2012/0168075 | A1 | 7/2012 | Abys et al. | |
| 2014/0335341 | A1 | 11/2014 | Park et al. | |
| 2020/0040231 | A1 | 2/2020 | Aoyagi et al. | |

FOREIGN PATENT DOCUMENTS

| | | |
|---|---|---|
| JP | 2002353614 A | 12/2002 |
| JP | 2003103562 A | 4/2003 |
| JP | 2006080473 A | 3/2006 |

OTHER PUBLICATIONS

Machine Translation of JP2006080473, 9 pages.
PCT International Search Report and Written Opinion in PCT/US2021/047923 dated Dec. 21, 2021, 11 pages.
Granado, Lerys, et al., "Supporting Information for: Improvements of the Epoxy-Copper Adhesion for Microelectronic Applications", Applied Electronic Materials, 6 pages.
Hashemi, Fatemeh Sadat Minaye, et al., "New Resist for Area Selective Atomic and Molecular Layer Deposition on Metal-Dielectric Patterns", J. Phys. Chem. C 2014, 118, 10957-10962.
Hourani, Rami, et al., "Selective Deposition through Organic Blocking Layers", Intel Corporation, Intel Look Inside Presentation (2014), 17 pages.
Lager, M., et al., "Advanced Non-Etching Adhesion Promoter for Next Generation IC Packaging", 2014 9th International Microsystems, Packaging, Assembly and Circuits Technology Conference (IMPACT), 2014, pp. 220-225.
Nair, Chandrasekharan, et al., "Sputtered Ti—Cu as a Superior Barrier and Seed Layer for Panel-based High-Density RDL Wiring Structures", Electronic Components & Technology Conference (2015), pp. 2248-2253.
Narahashi, Hirohisa, "Function Materials Group, Research Institute for Bioscience Products & Fine Chemicals, Ajinomoto Co., Inc., May 2013, 26 pages".
Narahashi, Hirohisa, et al., "Novel Thin Copper Transfer Films for Fine Line Formation on PCB Substrates", Transactions of The Japan Institute of Electronics Packaging, vol. 3, No. 1, 2010, 5 pages.
Nishimura, Yoshio, "Advanced Insulating Film for Next-Generation Smartphone Performance Requirements", Research Institute for Bioscience Products & Fine Chemicals, Ajinomoto Co., Inc., IEEE EPS Seminar (ECTC2019), May 30, 2019, 19 pages.
Park, Haesung, et al., "Nitrogen passivation formation on Cu surface by Ar—N2 plasma for Cu-to-Cu wafer stacking application", Microsystem Technologies (2019) 25:3847-3855.
Seo, Hankyeol, et al., "Two-Step Plasma Treatment on Sputtered and Electroplated Cu Surfaces for Cu-To-Cu Bonding Application", Appl. Sci. 2019, 9, 3535, 8 pages.
Thomas, "Inaugural-Dissertation to obtain the academic degree Doctor rerum naturalium (Dr. rer. nat) submitted to the Department of Biology, Chemistry and Pharmacy of Freie Universität Berlin", Mar. 31, 2016, 214 pages.

\* cited by examiner

METHODS FOR IMPROVED POLYMER-COPPER ADHESION

TECHNICAL FIELD

Embodiments of the disclosure generally relate to methods for improving adhesion between polymer films and metal interconnects. In particular, embodiments of the disclosure are directed to methods for improving polymer film adhesion with copper lines in electronic devices.

BACKGROUND

The high-density clustering of electronic components in a single printed circuit board (PCB) is increasing in complexity due at least in part to miniaturization. Multi-layer wiring structures use an insulating film between and separating the individual wiring layers with vias connecting the conductive lines. Via formation can be done by a multitude of processes with different accuracy, precision and hole densities. For example, photolithography using laser ablation can be used to create vias.

After formation of the insulating layers, a wiring pattern is formed in the insulating layers. This process can be repeated to form devices with multiple layers allowing more complicated electronic traces to be formed and increasing the number of circuit components.

Current electronic device packaging processes bond a polymeric material to the metal contacts. In some present processes, polymeric materials (e.g., Ajinomoto Buildup Film (ABF)) are formed on copper interconnects. Frequently, poor adhesion of the polymeric material to the metal contact results in delamination of the polymer from the metal. This results in reliability issues of a unit process involving the two materials.

The current state-of-the-art approach to solving issues of poor adhesion and to improve bonding between the ABF and copper is by increasing the surface roughness of the copper. This leads to loss of signal bandwidth.

Accordingly, there is a need in the art for methods of improving adhesion between copper pads and polymeric materials for device formation.

SUMMARY

One or more embodiments of the disclosure are directed to methods of forming a circuit board. A substrate with a first substrate surface and a second substrate surface is exposed to a bifunctional organic compound to form an adhesion layer on the first substrate surface. A resin layer is deposited on the adhesion layer, the first substrate surface and the second substrate surface.

Additional embodiments of the disclosure are directed to methods of forming circuit boards. A substrate with a copper pad and a dielectric surface is exposed to a bifunctional organic compound to form an adhesion layer on the copper pad. The adhesion layer comprises a monolayer or less of the bifunctional organic compound. The bifunctional organic compound has two different functional groups; one of the functional groups is reactive with the copper pad and the other of the functional groups is not reactive with the copper pad. A resin layer is deposited on the adhesion layer, the copper pad and the dielectric surface. A portion of the resin layer over the copper pad is removed by laser ablation to expose the copper pad through the resin layer and the resin layer is then cured.

Further embodiments of the disclosure are directed to circuit boards comprising a copper pad surface with a dielectric material surrounding the surface. An adhesion layer is on the copper pad. The adhesion layer comprises a bifunctional organic compound with two different functional groups; one of the functional groups is reactive with the copper pad and the other of the functional groups is not reactive with the copper pad. A resin layer is on the adhesion layer and the dielectric material. An opening is formed through the resin layer exposing a portion of the copper pad.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1A:
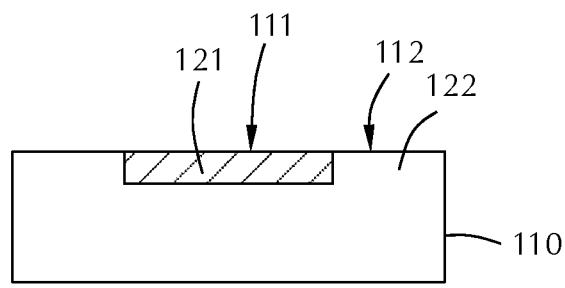
FIGS. 1A through 1E illustrate a processing method in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

One or more embodiments of the disclosure are directed to processes for improving the adhesion between a polymer-like film (e.g., Ajinomoto Buildup Film (ABF)) and copper. Embodiments of the disclosure improve the adhesion by chemical treatment of the copper or conductive surface. In some embodiments, the adhesion between the polymer film and copper is improved without increasing surface roughness of the copper.

In some embodiments, copper is treated with a bifunctional small organic molecule. The skilled artisan will understand that a functional group is a specific substituent or moiety within the molecule that is involved in the chemical reaction. Each functional group has different properties and reactivities. Functional groups include, but are not limited to alkenes, alkynes, cyclic groups, alcohols, carboxylic acids, phosphines, ketones, ethers, amines, amides, alkyl halides, thiols, sulfides, disulfides, anhydrides, nitro, acid chlorides, epoxides, imines and aldehydes. A bifunctional molecule, therefore, is one that contains two functional groups.

A "small" organic molecule, as used herein, comprises up to 50 atoms. In some embodiments, the small organic molecule comprises up to 40, 30, 25 or 20 atoms. In some embodiments, a small organic molecule comprises in the range of 5 to 50 atoms, or in the range of 6 to 40 atoms, or in the range of 7 to 35 atoms, or in the range of 8 to 30 atoms, or in the range of 9 to 25 atoms, or in the range of 10 to 20 atoms.

The bifunctional small organic molecules of some embodiments are selected so that one end of the molecule binds with the copper and the other end binds with the polymeric film. In some embodiments, the bifunctional small organic molecules comprise two different functional groups. In some embodiments, one of the functional groups is reactive with the copper and not reactive with the polymeric film. In some embodiments, the other of the functional groups is reactive with the polymeric film and not with the copper.

The treatment of the copper with the bifunctional small organic molecule can be in liquid or vapor phase. In the liquid phase, a very dilute solution of the molecules may be sufficient to form the adhesion promoting layer. Small organic molecules typically have relatively high vapor pressures and can be used in the vapor phase as well.

Referring to FIGS. 1A through 1E, one or more embodiments of the disclosure are directed to methods of forming a circuit board. A substrate 110 with a first surface 111 and a second surface 112 are exposed to a bifunctional organic compound. In FIG. 1A, the first surface 111 is the surface of a first material 121 and the second surface 112 is the surface of a second material 122. The first material 121 of some embodiments comprises copper. In some embodiments, the first material 121 consists essentially of copper. As used in this manner, the term "consists essentially of copper" means that greater than or equal to about 95%, 98%, 99% or 99.5% of the surface atoms are the stated species. In some embodiments, the first material 121 consists essentially of copper oxide. As used in this manner, the term "consists essentially of copper oxide" means that greater than or equal to about 95%, 98%, 99% or 99.5% of the surface atoms are copper or oxygen. In some embodiments, the first material 121 comprises a copper alloy. The second material 122 of some embodiments comprises a dielectric material. In some embodiments, the first material 121 is a conductive line or via within a dielectric material and the first surface comprises a copper pad.

Figure 1B:
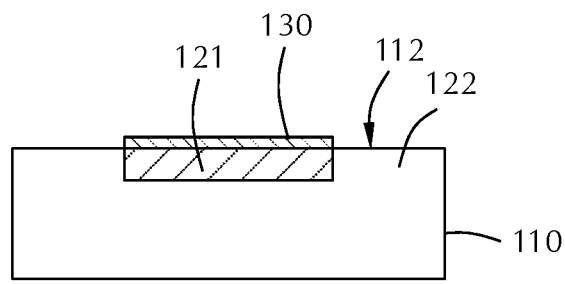

The substrate 110 of some embodiments is exposed to a bifunctional organic compound to form an adhesion layer 130 on the first substrate surface 111 of the first material 121, as illustrated in FIG. 1B. In some embodiments, the bifunctional organic compound forms the adhesion layer 130 selectively on the first material 121 relative to the second material 122. In some embodiments, selective formation of the adhesion layer 130 on the first material 121 is greater than or equal to 30:1 relative to the second material 122.

The substrate 110 can be exposed to the bifunctional organic compound by any suitable technique known to the skilled artisan. In some embodiments, the substrate 110 is soaked in a fluid comprising the bifunctional organic compound. In some embodiments, the fluid comprises a liquid comprising an amount of the bifunctional organic compound. In some embodiments, the fluid comprises a vapor phase material comprising the bifunctional organic compound.

Figure 1C:
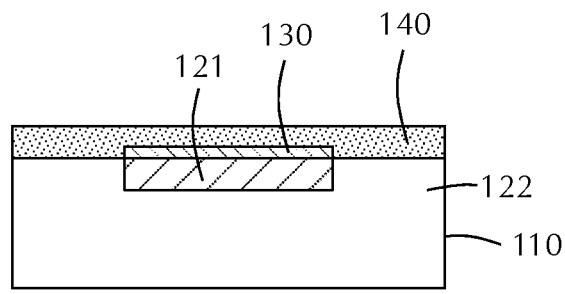

After formation of the adhesion layer 130, a resin layer 140 is deposited on the first substrate surface 111 and the second substrate surface 112. In some embodiments, the adhesion layer 130 is between the first substrate surface 111 and the resin layer 140 so that the resin layer 140 does not directly contact the first material 121, as illustrated in FIG. 1C.

Figure 1D:
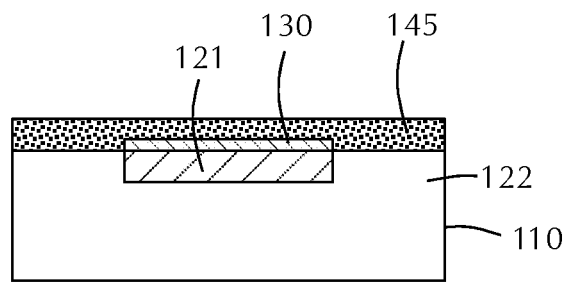

In some embodiments, the resin layer 140 is fluidic or ready for lamination and the resin layer 140 is exposed to a curing process to form a cured resin layer 145, as shown in FIG. 1D. The curing process can be any suitable process known to the skilled artisan and may depend on one or more of the resin species or the bifunctional organic compound.

The resin layer 130 can be any suitable material known to the skilled artisan. The resin layer 130 of some embodiments is determined based on, for example, material properties such as warpage, adhesion, coefficient of thermal expansion matching, mechanical strength and/or electrical properties. In some embodiments, the resin layer comprises an epoxy resin. In some embodiments, the cured resin layer comprises alcohol hydroxyl groups (—OH) throughout the structure of the cured resin layer. In some embodiments, the resin layer comprises a silica-filled polymer. In some embodiments, the resin layer comprises an Ajinomoto Build-up Film (ABF). In some embodiments, the resin layer 140 comprises ABF and is cured to form a cured resin layer 145 at a temperature in the range of 75° C. to 250° C. for a time in the range of 15 minutes to 90 minutes. In some embodiments, the rein layer 140 comprises ABF and is cured to form a cured resin layer 145 at a temperature in the range of 90° C. to 110° C. for a time in the range of 50 minutes to 70 minutes, or at a temperature in the range of 170° C. to 190° C. for a time in the range of 25 minutes to 35 minutes.

Figure 1E:
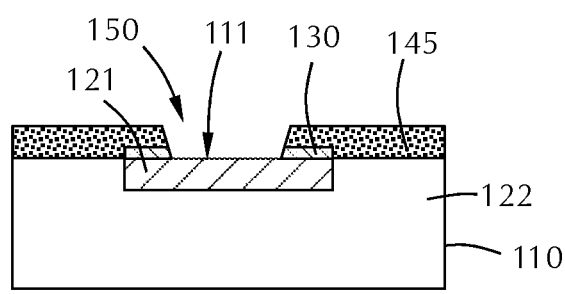

In some embodiments, after curing the resin layer 140 to form the cured resin layer 145, a portion 150 of the resin layer 145 over the first material 121 is removed to expose the first material surface 111, as shown in FIG. 1E. The portion 150 of the cured resin layer 145 that is removed can be less than, equal to or greater than the width of the first material 121. In some embodiments, the portion 150 removed is smaller than the width of the first material surface 111 so that there is some cushion for the alignment of the portion. For example, formation of a blind via with a copper pad opening for subsequent interconnect metallization. Adhesion issues between the cured resin layer 145 and the first material 121 often arise after opening of the copper pad. Some embodiments of the disclosure apply an adhesion layer to prevent void formation or delamination between the cured resin layer 145 and the first material 121.

In some embodiments, the first material comprises copper and removal of the portion 150 of the cured resin layer 145 exposes the copper pad through the cured resin layer 145.

The portion of the resin layer can be removed by any suitable technique known to the skilled artisan. In some embodiments, the portion 150 of the cured resin layer 145 is removed by laser ablation.

In some embodiments, the adhesion layer comprises a monolayer or less of the bifunctional organic compound. In some embodiments, the bifunctional organic compound chemisorbs to the surface of the first material and once all of the available active sites on the first material surface are occupied by the organic compound, the process of forming the adhesion layer stops. The adhesion layer may also be referred to as a self-assembled monolayer (SAM).

In some embodiments, the bifunctional organic compound comprises two different functional groups. In some embodiments, one of the functional groups comprises one or more of phosphonic acid ($-PO_3H_2$) or sulfonic acid ($-SO_3H$). In some embodiments, the first material comprises copper and one or more of the phosphonic acid or sulfonic acid groups of the bifunctional organic compound bind to the copper surface.

In some embodiments, one of the functional groups reacts with or binds to the first material (e.g., copper) and the other of the functional groups does not react with or bind to the first material. In some embodiments, one of the functional groups reacts with or binds to the resin layer and the other of the functional groups does not react with or bind to the resin layer. In some embodiments, one of the functional groups of the bifunctional organic compound reacts with or binds to the epoxy groups in the resin layer.

In some embodiments, a first functional group of the bifunctional organic molecules comprises one of a phosphonic acid group, a sulfonic acid group or a carboxylic acid group ($-COOH$) at one end of the molecule. The first functional group binds with the copper pad. In some embodiments, the second functional group of the bifunctional organic molecule comprises one of a carboxylic acid group or an aldehyde ($-CHO$) which can react with the abundant hydroxyl groups on the epoxy polymeric chain or surface and can act as a strong adhesion promoter.

In some embodiments, the bifunctional small organic molecule comprises a polar molecule. Bifunctional, small, polar organic molecules are water soluble and in some embodiments, the use of alkali/acid catalyst promotes binding of the carboxylic acid or aldehyde group to the $-OH$ on the epoxy. In some embodiments, the bifunctional organic compound comprises one of a phosphonic acid group, a sulfonic acid group or a carboxylic acid group on one end and one of a carboxylic acid group, an aldehyde group or a ketone ($-COX$, where X is a halogen or $NR_3$ and each R is a $C_1$-$C_6$ straight chain or aromatic group) on the other end of the compound with a $C_1$-$C_3$ straight chain or aromatic backbone.

The bifunctional organic compound of some embodiments comprises one or more of

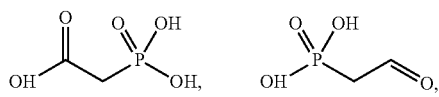

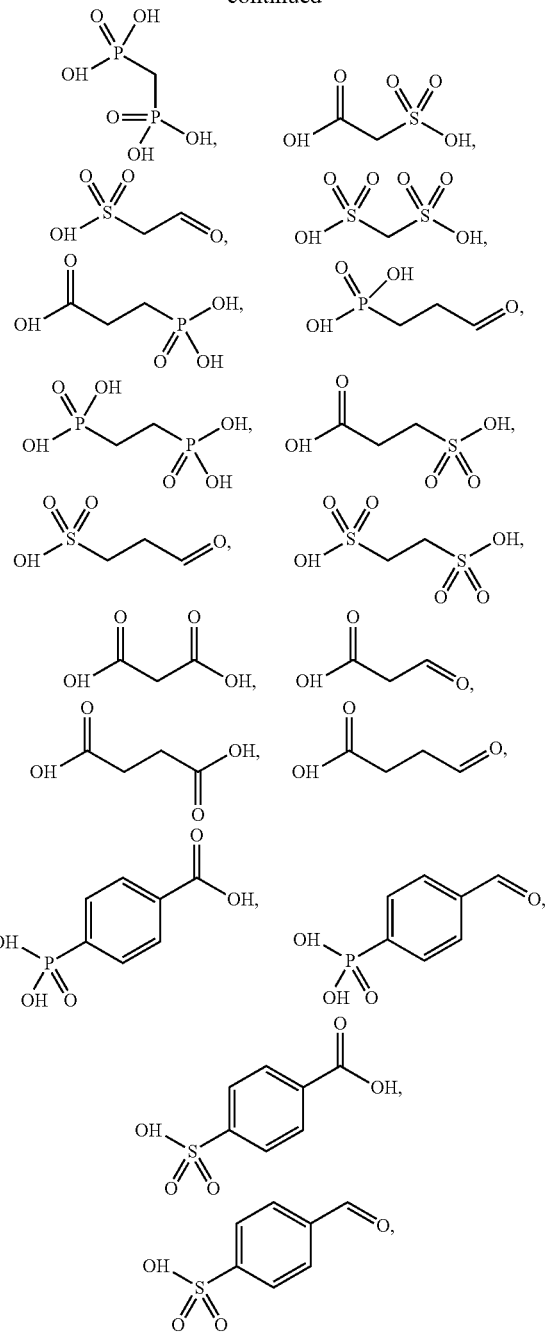

or an analogous compound in which the carboxylic acid group ($-COOH$) is substituted with a $-CO_X$ group, where X is a halogen or $NR_3$, where each R is independently a $C_1$-$C_6$ alkyl, alkenyl or alkynyl group.

Some embodiments of the disclosure are directed to circuit boards comprising a surface of a copper pad with a dielectric material surrounding the surface. An adhesion layer is on the copper pad and comprises a bifunctional organic compound having two different functional groups, one of the functional groups reactive with (binding to) the copper pad and the other of the functional groups not reactive with (not binding to) the copper pad. A resin layer is on the adhesion layer and the dielectric material with an opening formed through the resin layer exposing a portion of the copper pad.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a circuit board, the method comprising:
   exposing a substrate having a first substrate surface and a second substrate surface to a bifunctional organic compound to form an adhesion layer on the first substrate surface; and
   depositing a resin layer on the adhesion layer, the first substrate surface and the second substrate surface.

2. The method of claim 1, wherein the first surface comprises a copper pad.

3. The method of claim 1, wherein the second surface comprises a dielectric.

4. The method of claim 1, wherein the adhesion layer comprises a monolayer or less of the bifunctional organic compound.

5. The method of claim 1, wherein the bifunctional organic compound comprises two different functional groups.

6. The method of claim 5, wherein one of the functional groups reacts with copper and the other of the functional groups does not react with copper.

7. The method of claim 5, wherein one of the functional groups reacts with the resin layer and the other of the functional groups does not react with the resin layer.

8. The method of claim 5, wherein the bifunctional organic compound comprises one or more of

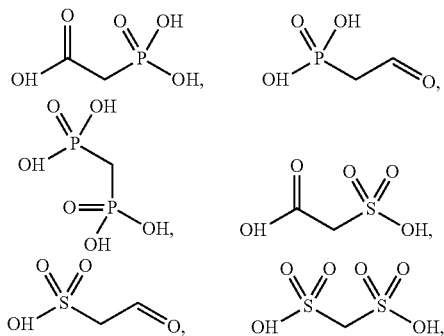

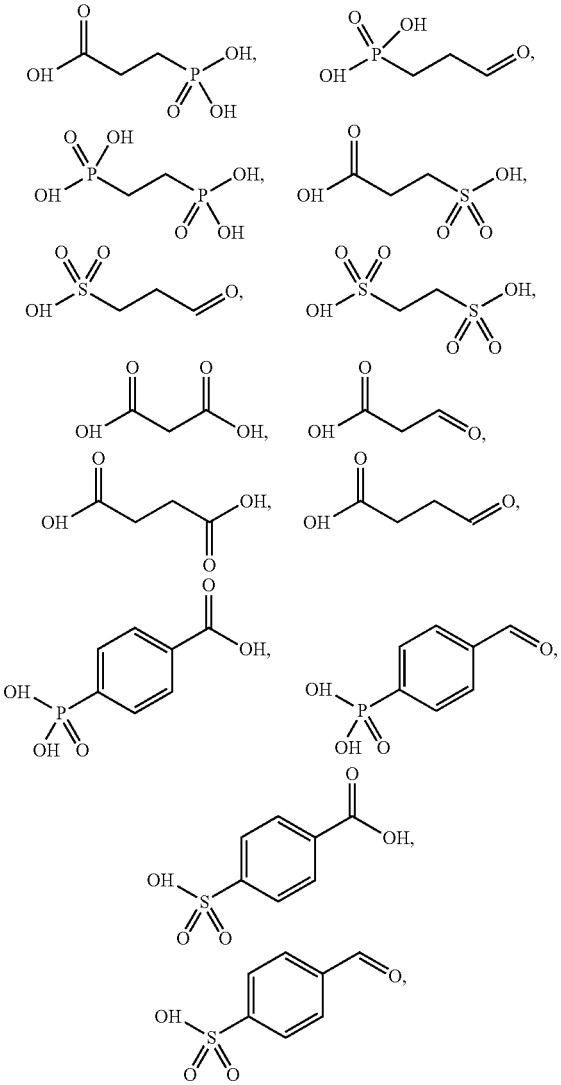

or an analogous compound in which the carboxylic acid group (—COOH) is substituted with a —CO$_x$ group, where X is a halogen or NR$_3$, where each R is independently a C$_1$-C$_6$ alkyl, alkenyl or alkynyl group.

9. The method of claim 1, wherein exposing the substrate to the bifunctional organic compound comprises soaking the substrate in a solution comprising the bifunctional organic compound.

10. The method of claim 1, wherein the resin layer comprises a silica-filled polymer.

11. The method of claim 10, wherein the resin layer comprises an Ajinomoto Build-up Film (ABF).

12. The method of any of claim 10, wherein one of the functional groups of the bifunctional organic compound reacts with epoxy groups in the resin layer.

13. The method of claim 1, further comprising removing a portion of the resin layer over the first material to expose the first material.

14. The method of claim 13, wherein the first material comprises copper and a copper pad is exposed through the resin layer.

15. The method of claim 13, wherein removing a portion of the resin layer comprises laser ablation.

16. The method of claim 13, further comprising curing the resin layer.

17. A method of forming a circuit board, the method comprising:
  exposing a substrate having a copper pad and a dielectric surface to a bifunctional organic compound to form an adhesion layer on the copper pad comprising a monolayer or less of the bifunctional organic compound, the bifunctional organic compound having two different functional groups, one of the functional groups reactive with the copper pad and the other of the functional groups not reactive with the copper pad;
  depositing a resin layer on the adhesion layer, the copper pad and the dielectric surface;
  removing a portion of the resin layer over the copper pad by laser ablation to expose the copper pad through the resin layer; and
  curing the resin layer.

18. The method of claim 17, wherein the adhesion layer comprises a monolayer or less of the bifunctional organic compound, the bifunctional organic compound comprising one or more of

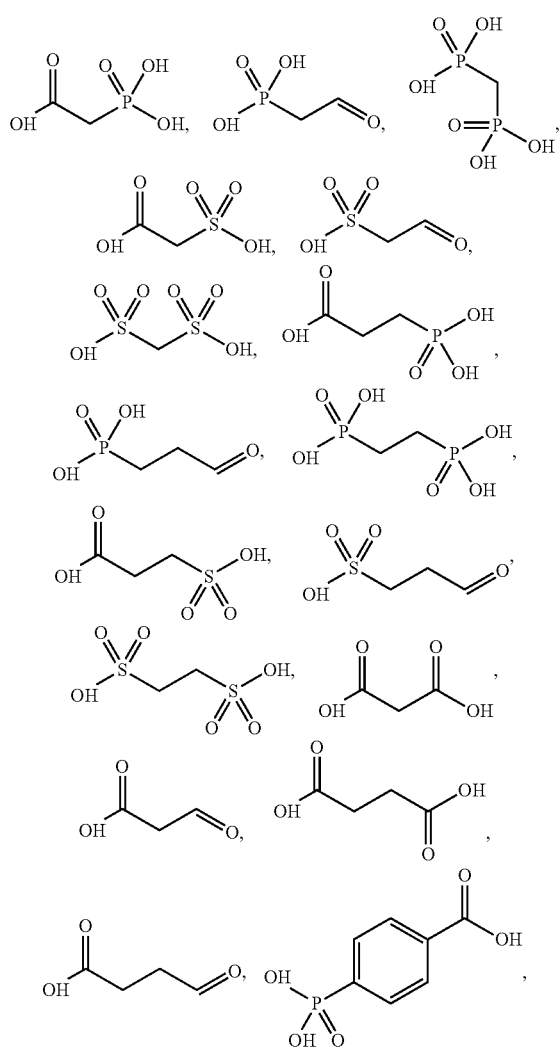

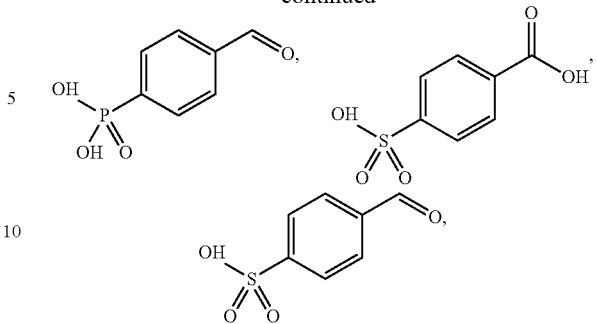

or an analogous compound in which the carboxylic acid group (—COOH) is substituted with a —CO$_x$ group, where X is a halogen or NR$_3$, where each R is independently a C$_1$-C$_6$ alkyl, alkenyl or alkynyl group.

19. A circuit board comprising:
  a surface of a copper pad with a dielectric material surrounding the surface;
  an adhesion layer on the copper pad, the adhesion layer comprising a bifunctional organic compound, the bifunctional organic compound having two different functional groups, one of the functional groups reactive with the copper pad and the other of the functional groups not reactive with the copper pad; and
  a resin layer on the adhesion layer and the dielectric material with an opening formed through the resin layer exposing a portion of the copper pad.

20. The circuit board of claim 19, wherein the adhesion layer comprises a monolayer or less of the bifunctional organic compound, the bifunctional organic

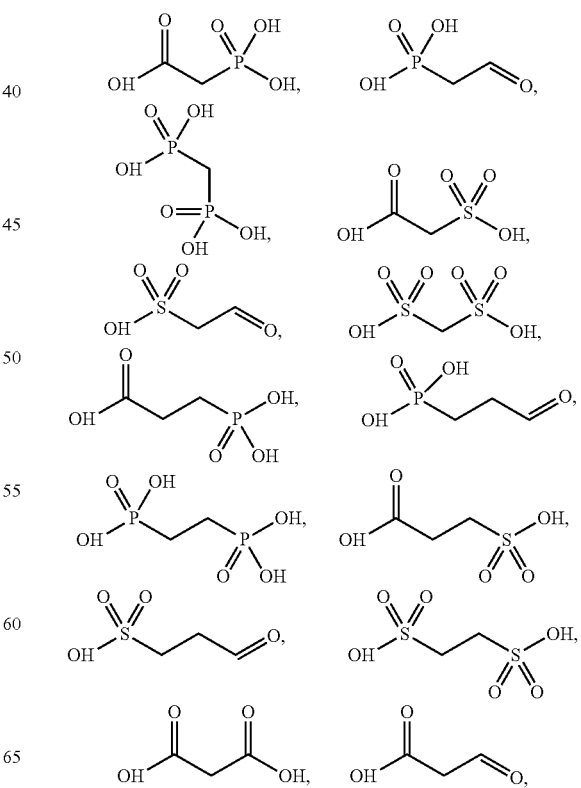

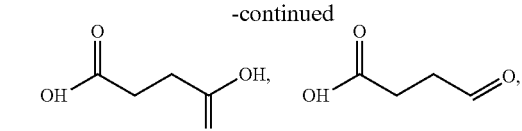
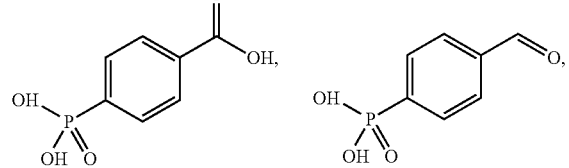
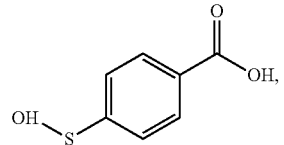
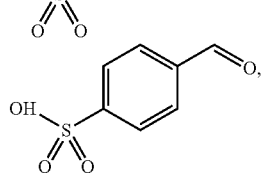
or an analogous compound in which the carboxylic acid group (—COOH) is substituted with a —CO$_x$ group, where X is a halogen or NR$_3$, where each R is independently a C$_1$-C$_6$ alkyl, alkenyl or alkynyl group.
* * * * *